(12) United States Patent
Lerner et al.

(10) Patent No.: US 10,656,608 B1
(45) Date of Patent: May 19, 2020

(54) SMART POWER CORD AND FACILITY DEVICE MANAGEMENT SYSTEM

(71) Applicants: Ian Amihay Lerner, La Jolla, CA (US); Alistair Ian Chatwin, Highlands Ranch, CO (US)

(72) Inventors: Ian Amihay Lerner, La Jolla, CA (US); Alistair Ian Chatwin, Highlands Ranch, CO (US)

(73) Assignee: ANACOVE, LLC, La Jolla, CA (US)

( * ) Notice: Subject to any disclaimer, the term of this patent is extended or adjusted under 35 U.S.C. 154(b) by 0 days.

(21) Appl. No.: 16/672,373

(22) Filed: Nov. 1, 2019

(51) Int. Cl.
| | |
|---|---|
| *G05B 15/02* | (2006.01) |
| *G08C 17/02* | (2006.01) |
| *G01R 19/165* | (2006.01) |
| *G06F 13/40* | (2006.01) |
| *G06F 16/23* | (2019.01) |
| *H04B 17/318* | (2015.01) |
| *H04W 76/10* | (2018.01) |
| *H04W 84/12* | (2009.01) |
| *H04W 84/18* | (2009.01) |
| *H04W 88/02* | (2009.01) |
| *H04W 4/80* | (2018.01) |

(52) U.S. Cl.
CPC ....... *G05B 15/02* (2013.01); *G01R 19/16528* (2013.01); *G06F 13/4022* (2013.01); *G06F 16/2393* (2019.01); *H04B 17/318* (2015.01); *H04W 76/10* (2018.02); *H04W 4/80* (2018.02); *H04W 84/12* (2013.01); *H04W 84/18* (2013.01); *H04W 88/02* (2013.01)

(58) Field of Classification Search
CPC ....... G05B 15/02; G08C 17/02; G01R 19/165
See application file for complete search history.

(56) References Cited

U.S. PATENT DOCUMENTS

| 4,945,341 | A | * | 7/1990 | Buttimer | G08B 13/1409 340/539.1 |
|---|---|---|---|---|---|
| 7,099,785 | B2 | | 8/2006 | Lee et al. | |
| 7,811,119 | B2 | | 10/2010 | Caveney et al. | |
| 9,888,337 | B1 | | 2/2018 | Zalewski et al. | |
| 9,911,290 | B1 | | 3/2018 | Zalewski et al. | |
| 10,133,327 | B2 | | 11/2018 | Alford et al. | |
| 10,145,884 | B2 | | 12/2018 | Alford et al. | |

(Continued)

*Primary Examiner* — Mark A Connolly
(74) *Attorney, Agent, or Firm* — Arc IP Law, PC; Joseph J. Mayo

(57) ABSTRACT

A smart power cord with integrated sensors and wireless interfaces to manage devices in a facility such as a hotel. Each cord may monitor power delivered to an attached device, and may measure variables such as temperature, humidity, and pressure. It may also act as a gateway to other devices in the vicinity. A central control station may manage the devices in the facility via the smart power cords. Data collected from smart power cords may be analyzed to provide alerts and management reports. Illustrative alerts may warn of attempted theft when a device is unplugged, of environmental conditions that suggest mold risks or HVAC problems, or of a staff member requesting assistance via an emergency alert forwarded through a smart power cord. Locations of smart power cords may be automatically configured using either cooperative or non-cooperative localization based on measurement of signal characteristics such as RSSI.

20 Claims, 13 Drawing Sheets

(56) References Cited

U.S. PATENT DOCUMENTS

| | | | |
|---|---|---|---|
| 2005/0162282 A1* | 7/2005 | Dresti | G05B 15/02 |
| | | | 340/12.3 |
| 2008/0218148 A1 | 9/2008 | Robertson et al. | |
| 2009/0167494 A1 | 7/2009 | Martins | |
| 2010/0145536 A1 | 6/2010 | Masters et al. | |
| 2018/0115130 A1 | 4/2018 | Truluck et al. | |
| 2018/0288721 A1* | 10/2018 | Blaser | H04L 67/12 |
| 2019/0073884 A1* | 3/2019 | Payne | G08B 7/06 |

* cited by examiner

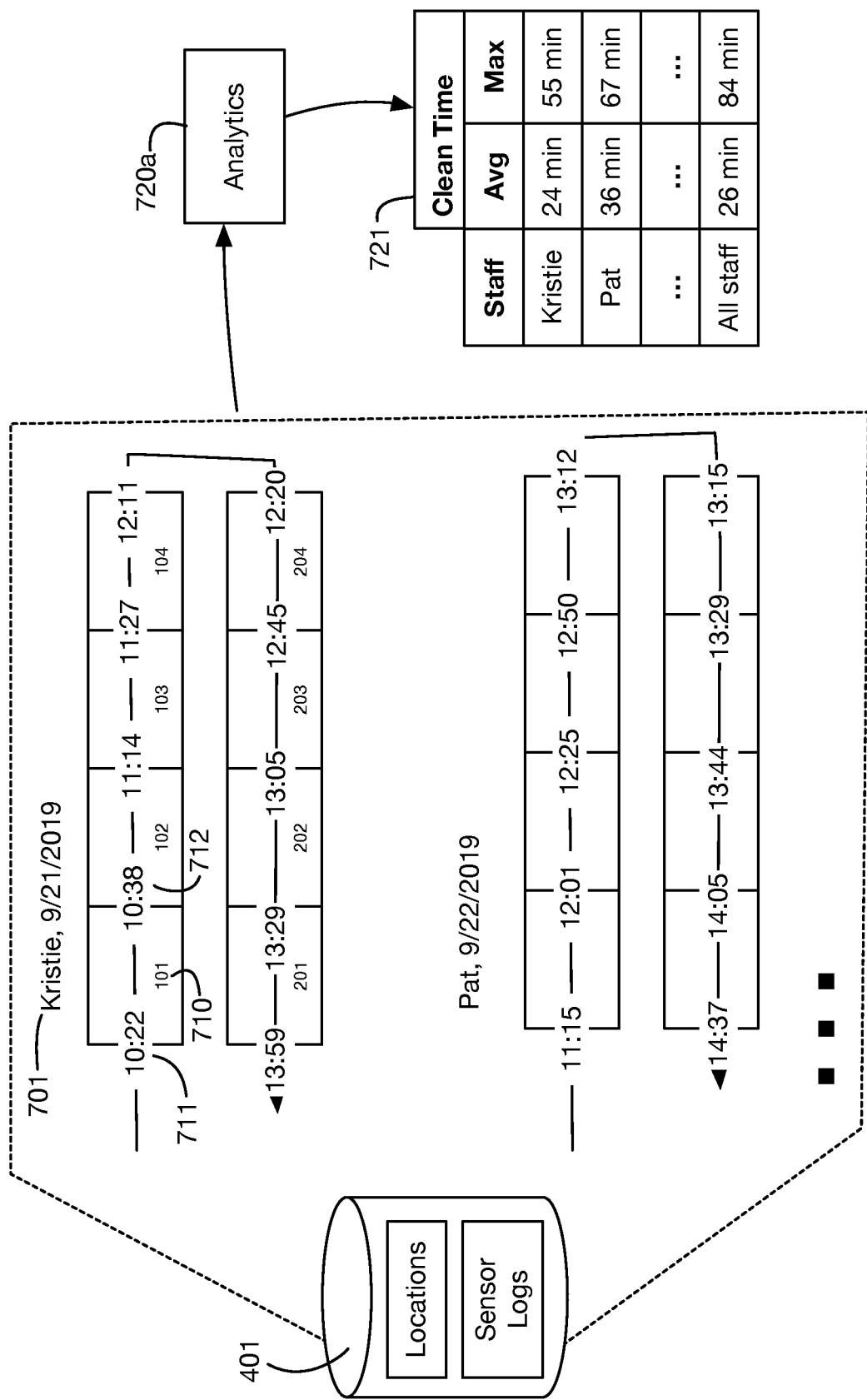

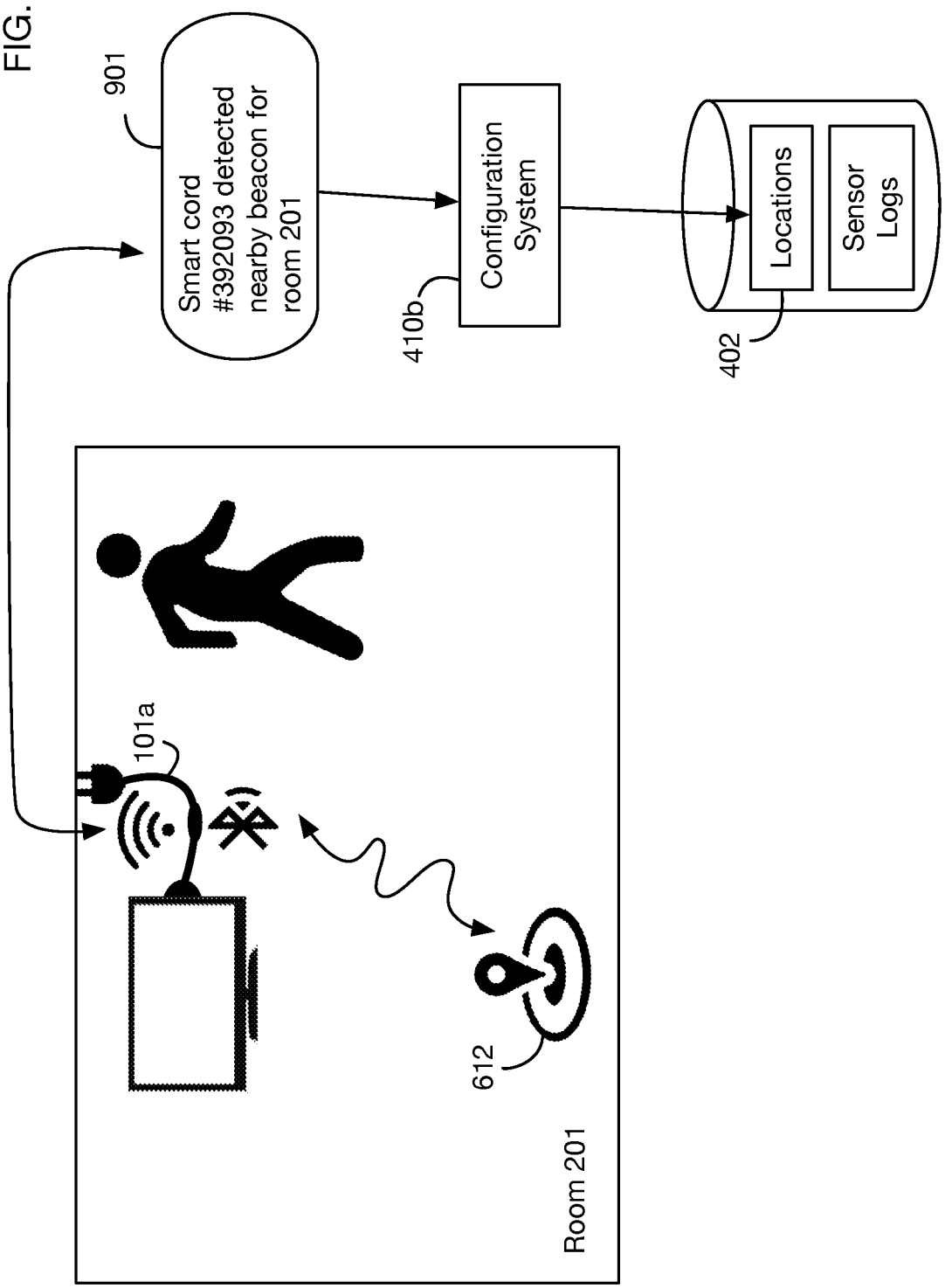

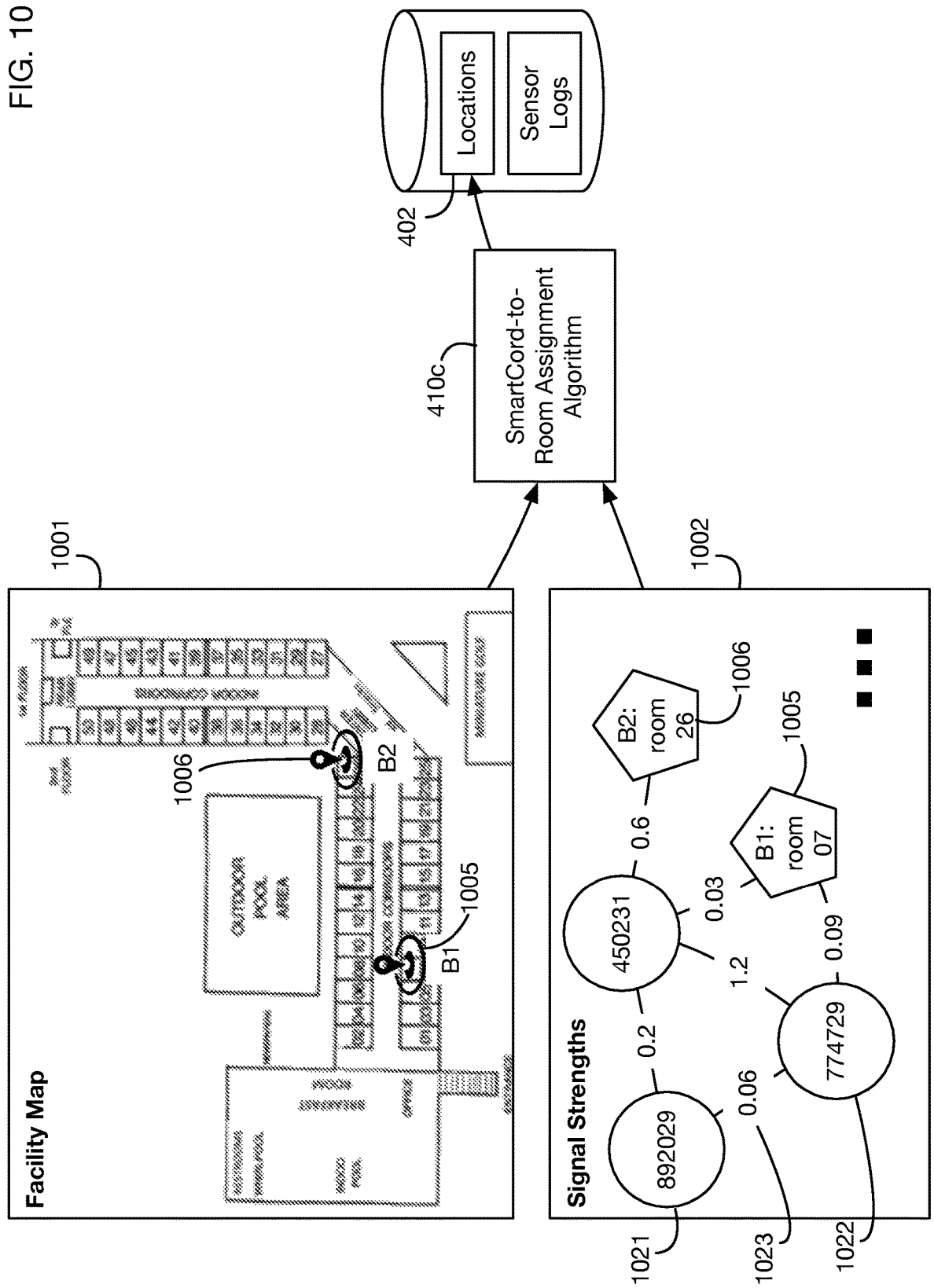

SMART POWER CORD AND FACILITY DEVICE MANAGEMENT SYSTEM

BACKGROUND OF THE INVENTION

Field of the Invention

One or more embodiments of the invention are related to the fields of power electronics, networking and building and facility management systems. More particularly, but not by way of limitation, one or more embodiments of the invention enable a smart power cord and facility device management system and automated network topology discovery.

Description of the Related Art

Facilities such as hotels face a significant challenge in managing all of the electronic devices installed throughout the facility. These challenges include monitoring usage, responding to device failures, preventing theft, and optimizing device installation and utilization. Hotels have attempted to address theft by physically securing devices to walls or furniture, and they have attempted to control utilization with systems such as room entry card systems that require a card to be inserted before turning on in-room devices. These solutions can be easily defeated, and they are complex to install and maintain. In addition, many guests leave televisions and air conditioners or heaters on when not in their rooms and when checking out. This results in higher operation and wear and tear costs to the hotel as the energy usage in these scenarios is undesirable.

A more sophisticated and potentially more effective approach is to use network enabled devices, such as Internet-of-Things (IoT) devices, and to manage these devices remotely from a central office. While network connected devices offer many advantages, installing and configuring the necessary network infrastructure and network enabled devices using known devices is a significant challenge, and requires significant labor by installers and managers as well as time required in each room.

There are no known wireless power cord solutions that enable automated network configuration and topology discovery. There are also no known solutions that use existing devices such as power cords with wireless connectivity to determine analytics associated with power usage and other environmental sensor values for hotel rooms. There are no known solutions that provide a device controller in a smart power cord that may serve as a gateway for other devices in a room, for example using a different wireless technology such as Bluetooth®.

In addition, there are no known solutions that enable maids or other non-technical personnel to install an intelligent power cord by merely plugging it in to enable discovery of the cord and integration into the system. There are also no known solutions that enable a maid to alert management or security of an emergency or sexual harassment or determine efficiency of each maid in cleaning each room via a wireless device coupled to each maid.

For at least the limitations described above there is a need for a smart power cord and facility device management system.

BRIEF SUMMARY OF THE INVENTION

One or more embodiments of the invention are related to a smart power cord and facility device management system and automated network topology discovery. Smart power cords may be installed throughout a facility to replace existing power cords. Electronics embedded in the smart power cords may provide capabilities to manage devices in the facility and to monitor the facility environment from a central location.

One or more embodiments may include multiple smart power cords, a database, a smart power cord configuration system, and a control system. Each smart power cord has a power input connector that can be connected to a power source, a power output connector that can be connected to a device (such as a television, for example), a cable with conductors and a jacket, and a monitoring and control element integrated into the cable and lying within the jacket. The monitoring and control element may have one or more sensors, including a current sensor that measures current flowing through the conductors. Other sensors may include for example, without limitation, a temperature sensor, a humidity sensor, and a pressure sensor. The monitoring and control element may have a memory with an identifier of the smart power cord. The smart power cord apparatus generally includes a switch that can open or close one or more of the conductors, a wireless network interface, and a processor. The processor may be configured to receive sensor data from the sensors, transmit this sensor data via the wireless interface, receive power commands from the wireless interface, and open or close the switch based on the received power commands.

The database may include location data that associates the identifier of each smart power cord with the location of the cord, and a sensor data log for each smart power cord. The configuration system may update the location data when each smart power cord is installed.

The control system may include a control system processor, a network interface, and a user interface. The control system processor may receive sensor data via the network interface from the smart power cords, update the sensor data log in the database, and monitor the sensor data log to detect events. Detected events may be displayed in the user interface with the location of the smart power cord that generated the data associated with the event. Power commands (or other commands) for a selected smart power cord may be entered in the user interface, and may be transmitted to the designated smart power cord over the network.

Events detected by the control system may include for example an unplugged event, detected when the current of a smart power cord falls below a threshold value.

In one or more embodiments the monitoring and control element components may be enclosed in a hard case that lies within the cable jacket. The length of this case along the cable axis may be for example 10 centimeters or less, and the maximum diameter perpendicular to the cable may be for example 2 centimeters or less.

In one or more embodiments the monitoring and control element may have a second wireless interface. The first wireless interface may be for example a Wi-Fi interface, and the second wireless interface may be for example a Bluetooth interface. The processor of the smart power cord may detect local devices over the second wireless interface, and may receive data from these devices and forward this device data on the first wireless interface to the control system. Local devices (which may be for example Bluetooth or Bluetooth low energy devices) may include for example, without limitation, a thermostat, a water leak detector, a motion sensor, and a beacon. Local device data may be added to the sensor data log in the database. This local device data may be used for event detection. For example, a water leak detector may generate a leak detection signal, which may be reported by the control system as water leak event at the associated location.

In one or more embodiments, local devices that may communicate with a smart power cord may include beacons attached to personnel. A personnel beacon may include an emergency input to request assistance; when a person requests assistance, the personnel beacon may forward this request to the control system via the smart power cord. This message generates an alert that may for example identify the person requesting assistance and his or her location.

Smart power cord configuration, which associates each smart power cord with the location in which it is installed, may be manual or automated. In a manual configuration system, an installer may use a portable device into which the location of the installation is input. This portable device may connect to the smart power cord being installed, and may obtain its identifier. The smart power cord identifier and the location may then be transmitted to the database to update the location data.

In one or more embodiments, configuration of smart power cords may be automated if for example a beacon is available in the location in which a cord is installed. The smart power cord may detect the nearest visible beacon, and may use the known location of this beacon to update the location data of the smart power cord.

In one or more embodiments, the control system may analyze sensor log data to generate analytics that are displayed in the user interface. Illustrative analytics may include for example, without limitation, an analysis of usage patterns of devices powered by the smart power cords, the risk of mold growth in locations in which smart power cords are installed, and analysis of staff locations and movements over time.

BRIEF DESCRIPTION OF THE DRAWINGS

The above and other aspects, features and advantages of the invention will be more apparent from the following more particular description thereof, presented in conjunction with the following drawings wherein:

FIGS. 7A through 7D show illustrative analytics calculated from sensor data collected from smart power cords. FIG. 7A shows analyses of staff movements and efficiency. FIG. 7B shows illustrative alerts for mold, open windows, device faults, or noise. FIG. 7C shows analyses of TV usage. FIG. 7D shows analyses of HVAC efficiency.

FIG. 9 shows an illustrative process that automatically configures a smart power cord based on a nearby beacon.

FIG. 10 shows an illustrative process that automatically configures a collection of smart power cords based on signal strengths between the cords and based on a map of a facility.

DETAILED DESCRIPTION OF THE INVENTION

A smart power cord and facility device management system will now be described. In the following exemplary description, numerous specific details are set forth in order to provide a more thorough understanding of embodiments of the invention. It will be apparent, however, to an artisan of ordinary skill that the present invention may be practiced without incorporating all aspects of the specific details described herein. In other instances, specific features, quantities, or measurements well known to those of ordinary skill in the art have not been described in detail so as not to obscure the invention. Readers should note that although examples of the invention are set forth herein, the claims, and the full scope of any equivalents, are what define the metes and bounds of the invention.

Figure 1:
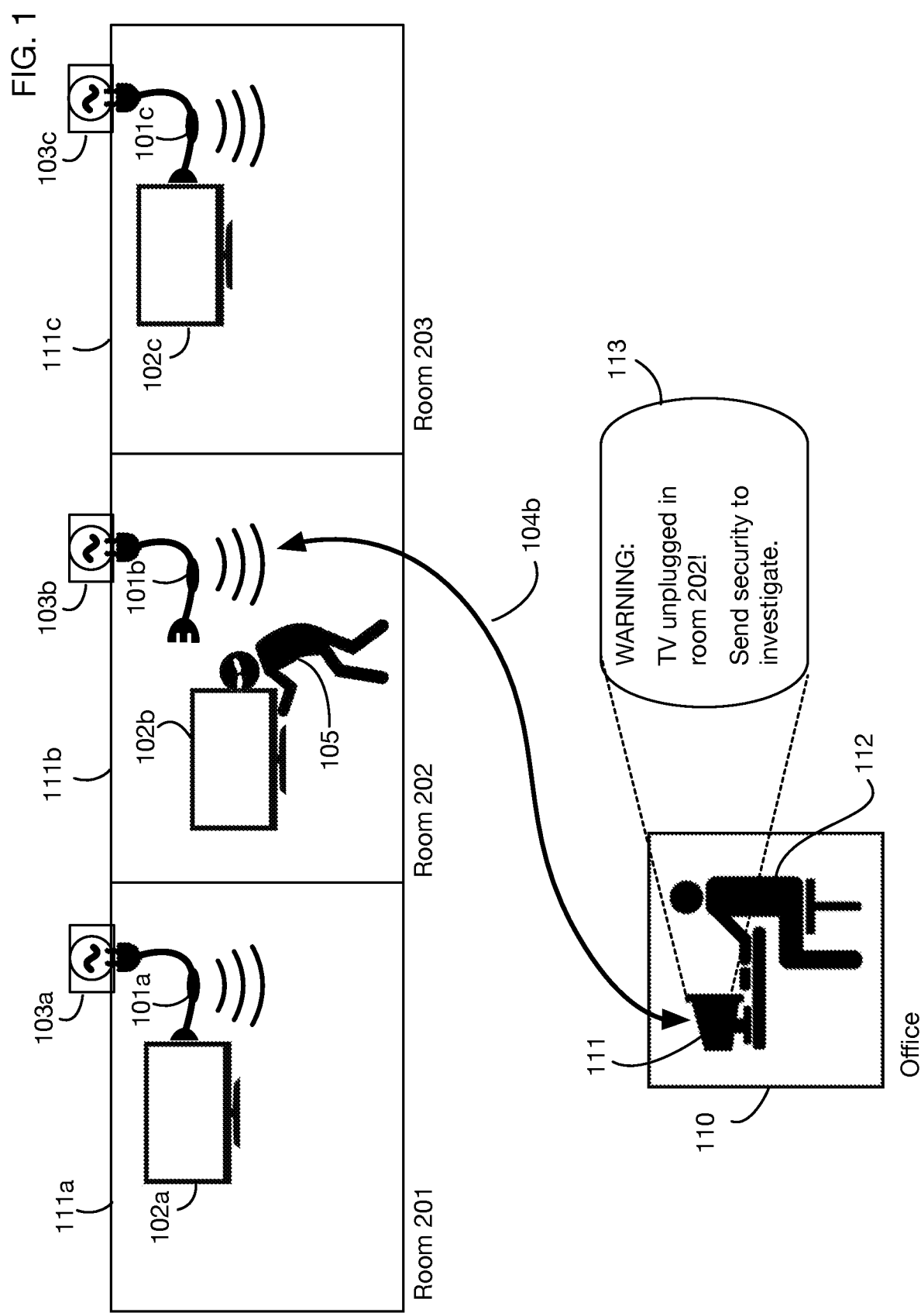
FIG. 1 shows a hotel with smart power cords attached to room televisions; when a thief unplugs a television to steal it, an alert is sent to the hotel office.

FIG. 1 shows an illustrative application of smart power cords in a facility, in this case a hotel. Each of three illustrative hotel rooms 111a, 111b, and 111c has an associated television 102a, 102b, and 102c, respectively. The hotel installs smart power cords 101a, 101b, and 101c to connect televisions 102a, 102b, and 102c to room power sources 103a, 103b and 103c, respectively. As described below, in addition to power conductors, each smart power cord contains electronics such as one or more sensors, a processor, and one or more wireless network interfaces. In particular, a smart power cord may contain a sensor that monitors the flow of current through the cord. When an attached device (such as a television) is disconnected, the drop in current to zero (or below a threshold) may be detected by the current flow sensor, and reported by the smart power cord via a wireless interface. (When a device such as a television is turned off, but connected to power, it typically continues to draw some standby current; thus, the current sensor can distinguish between a connected device that is off and a disconnected device.) The hotel may therefore monitor the current flow through each smart power cord to detect when an associated television (or other connected device) is disconnected. Unplanned disconnection may for example indicate an attempted theft. In the example of FIG. 1, a thief 105 disconnects television 102b from smart power cord 101b (or alternatively disconnects the cord 101b from the power source 103b). The cord 101b transmits the current change over a wireless channel 104b to computer 111 used by operator 112 in hotel office 110. Computer 111 may be any processor or collection of processors. A monitoring and analysis system executing on computer 111 (or on another device) then generates an alert message 113 that shows that the television is disconnected. This message 113 also indicates the room that the disconnected smart power cord is installed in. Message 113 is shown in a user interface on a display associated with computer 111.

If thief 105 disconnects the television 102b and the attached smart power cord 101b from the power source 103b, the smart power cord electronics will also be disconnected from the power source. In one or more embodiments, a backup battery or capacitor may be included so that the smart power cord can transmit the associated current drop event over the wireless channel 104b. Alternatively, a heartbeat signal may be sent periodically (for example, every second) from the smart power cord to the computer 111, and an event may be generated if the heartbeat signal ceases, which may also indicate that the smart power cord is unplugged.

The scenario illustrated in FIG. 1 is illustrative; in one or more embodiments, smart power cords may be attached to any type or types of devices in any type of facility. A smart power cord may be used in any situation where a normal power cord may be used to power a device. For example, without limitation, a smart power cord may be attached to a television, a stereo, a radio, a computer, a clock, a speaker, an appliance, or a light. In one or more embodiments a smart power cord may connect to multiple devices, for example via a power strip integrated into the smart power cord. A smart power cord may connect to any type of power source, including for example, without limitation, 110V AC power, 220V AC power, or DC power. In one or more embodiments a smart power cord may include a battery or a connection to a battery. A facility may use multiple smart power cords in a room, for example for different devices.

Network connection 104b between a smart power cord and a network interface of computer 111 may use any type or types of links, including wireless links, wired links, or combinations thereof. For example, in one or more embodiments a smart power cord may communicate wirelessly with a wireless access point in a room or elsewhere in a facility, and the wireless access point may be connected to computer 111 via a wired or other wireless link. In one or more embodiments, connection 104b may include Internet connections. Computer 111 may be located within the facility or remote to the facility. In one or more embodiments, computer 111 may be a network of devices, and data and processing may be distributed across these devices. For example, data from smart power cords may be transmitted to a remote server or database, and then accessed by a local device within the facility. Computer 111 may be any processor or collection of processors, including for example, without limitation, a desktop computer, a laptop computer, a server, a mobile device, a mobile phone, a tablet, a notebook, or a microprocessor.

Figure 2:
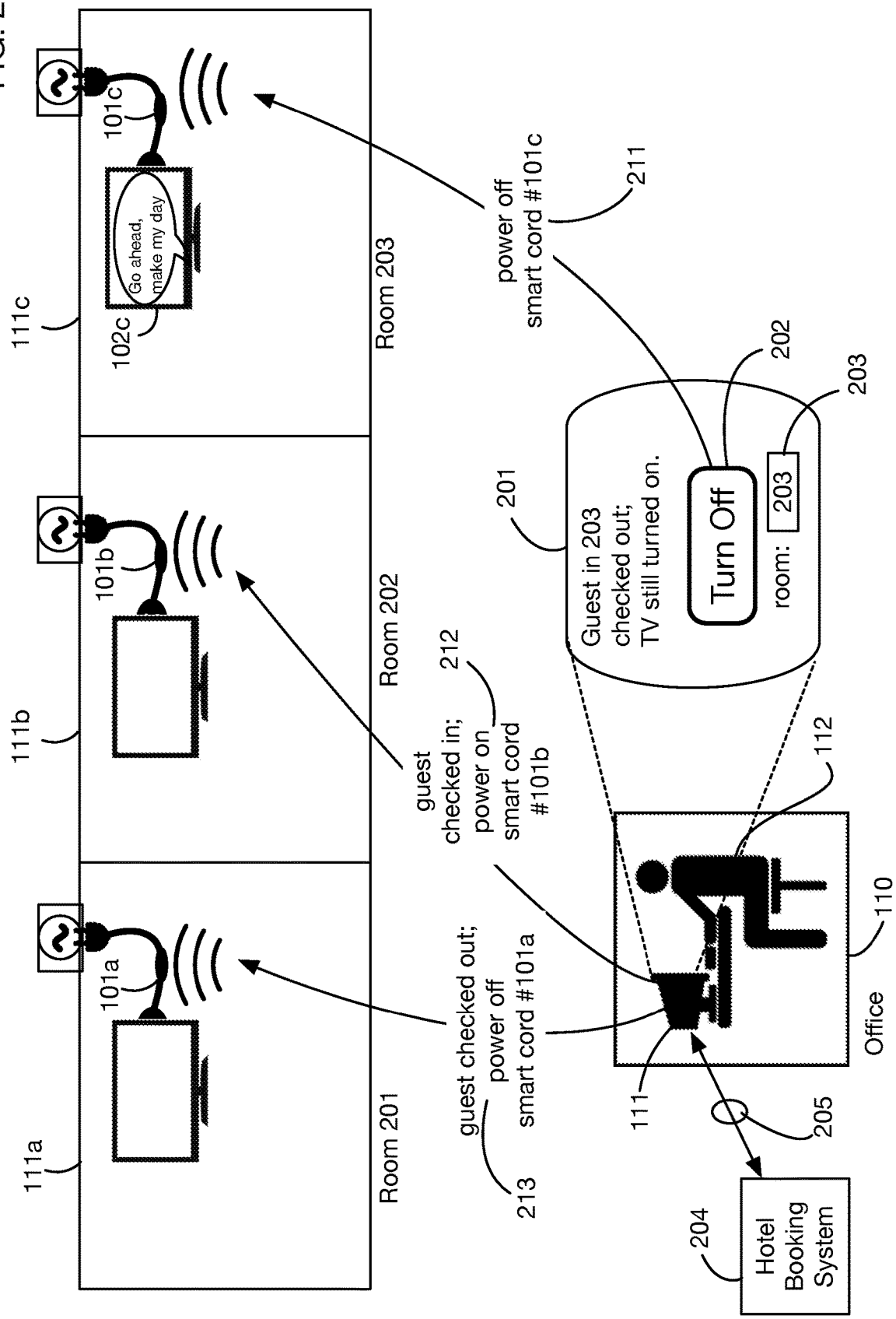
FIG. 2 shows the hotel of FIG. 1 with a television that is inadvertently left on after a guest checks out; the office operator can turn off the television remotely by sending a power off command to the smart power cord.

FIG. 2 shows another illustrative application of a smart power cord: remote power control. In this scenario, current data from smart power cord 101c indicates that television 102c is turned on. This data may be combined with guest check-in and checkout information from the hotel booking system 204 to generate alert 201, which indicates that the guest has checked out, but the associated television is still turned on. (For example, a smart power cord control system executing on computer 111 may have an interface 205 with the booking system 204; this interface 205 may for example use an API or message passing interface exposed by the booking system.) Operator 112 may then use control 202 to send a command 211 to smart power cord 101c to turn off power to television 102c. This capability may for example help the facility avoid unnecessary power consumption. In general, communication between a smart power cord 101c and computer 111 may be bidirectional: sensor data may be transmitted from the smart power cord to the computer, and commands may be transmitted from the computer to the smart power cord. Since computer 111 may be used to control and monitor multiple smart power cords, operator 112 may also indicate which cord is the intended recipient of a command, for example with input field 203. For the alert screen 201, this input field 203 is prepopulated with the location of the smart power cord that is inadvertently left on. Computer 111 may also provide a user interface for general power control that allows the operator to view the current power consumption of each power cord, and to select any smart power cord and turn on or off power to the device attached to that cord.

In one or more embodiments, power management commands may be sent automatically to smart power cords without requiring operator input. For example, hotel booking system 204 may indicate when a guest checks into or out of a room, and the smart power cord in the room may be automatically turned on upon check-in and automatically turned off upon check-out. These scenarios are illustrated in FIG. 2, where system 111 automatically generates a power on message 212 when a guest checks in to the associated room 111b, and automatically generates a power off message 213 when a guest checks out of the associated room 111a. Automatically management of smart power cords based on data from a hotel booking system or similar system 204 may result in considerable power savings for a facility. For example, a typical television may draw 50 watts of power when it is turned on, and 2 watts of power in standby mode. Turning off smart power cords in rooms without guests therefore may save at least 2 watts, and up to 50 watts, per room. Since a smart power cord may draw for example only 0.5 watts of power, the net savings in power consumption from adding smart power cords may be substantial, particularly for large facilities.

Figure 3:
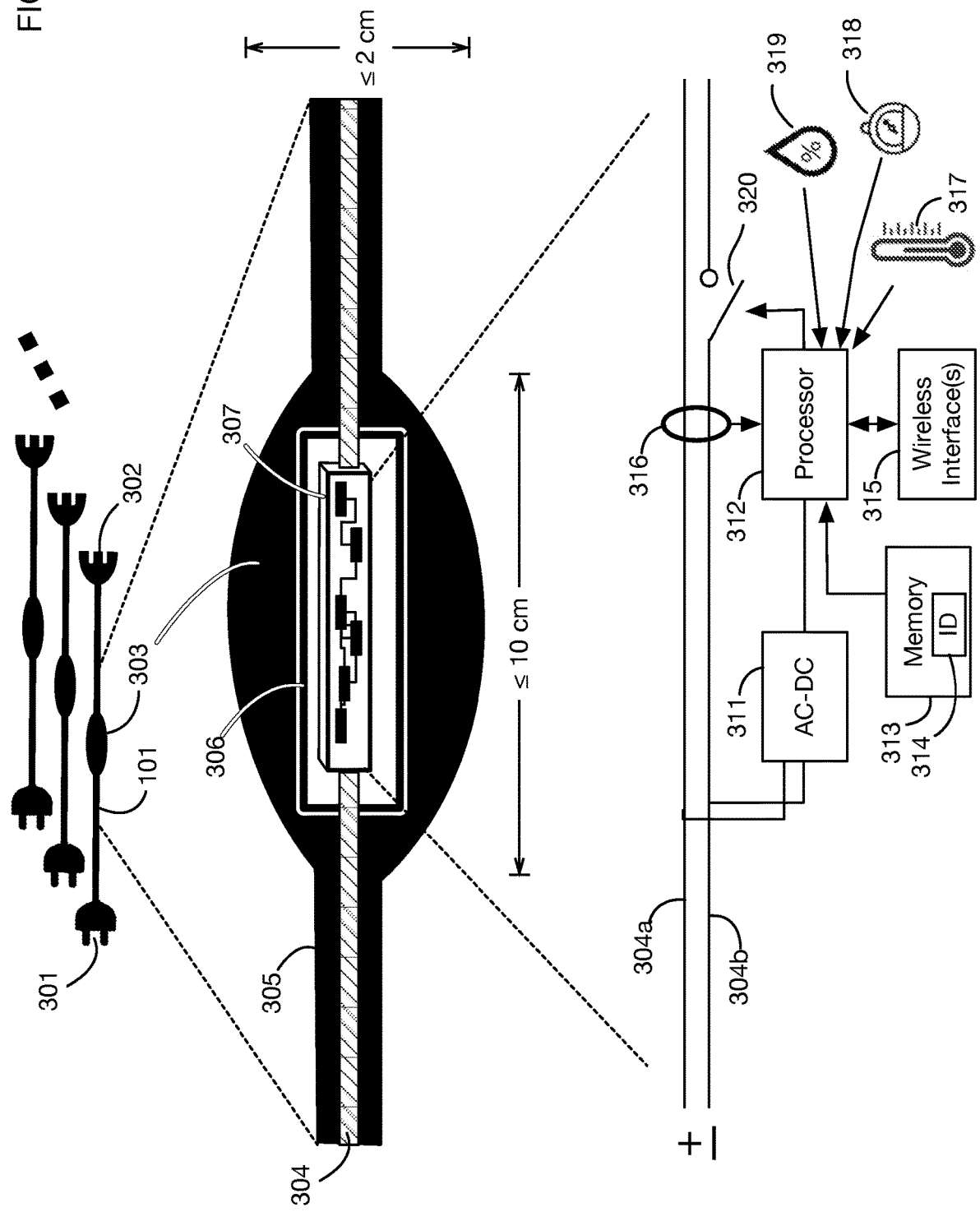
FIG. 3 shows an illustrative schematic of a smart power cord.

FIG. 3 shows an illustrative schematic of a smart power cord 101. Cord 101 may have a power input connector 301 that is configured to attach to a power source, and a power output connector 302 that is configured to attach to a device (such as a television). The cable running between the power input connector and the power output connector may have one or more conductors 304 that transmit power, surrounded by an insulating jacket 305. A monitoring and control element 307 may be integrated into the smart power cord and located within the jacket 305. This element may be located for example in a protrusion 303 in the cable jacket in the middle portion of the cord between the input and output connectors. The size of the protrusion may vary depending on the components included in the monitoring and control element 307. In an illustrative embodiment, the protrusion may be approximately 10 centimeters long and 2 centimeters in diameter, or smaller. In one or more embodiments there may be no visible protrusion and the components may be miniaturized to the point that they can be placed within the normal cable jacket. The monitoring and control element components may be encased in a protective housing 306, which may be for example a hard plastic or aluminum tube that protects the components from bending or impact.

Illustrative components of the monitoring and control element 307 are shown in FIG. 3. Conductors 304a and 304b provide the power circuit between the power input and the connected device. For an AC power source, an AC to DC converter 311 converts this AC power to the DC voltage or voltages needed to drive the electronic components of the smart power cord. Components may include a processor 312, a memory 313, and one or more wireless communications interfaces 315. Wireless interfaces 315 may for example include either or both of Wi-Fi and Bluetooth interfaces. The Bluetooth interface may support Bluetooth low-energy transmission for communication with low-power devices. The memory 313 may for example include a stored unique identifier 314 for the smart power cord.

Components of the monitoring and control element may also include one or more sensors. A current sensor 316 may monitor the flow of current through the conductors; this sensor may be for example a toroid current sensor. Other sensors may include for example, without limitation, a temperature sensor 317, a pressure sensor 318, and a humidity sensor 319. These sensors are illustrative; one or more embodiments may include any types of sensors in the smart power cord. Some of these sensors may be integrated into combined sensing components; for example, a single sensor module may provide both temperature and humidity data. The monitoring and control element 307 may also include one or more actuators, such as switch 320 that opens or closes the power conductor circuit under control of processor 312. Switch 320 may be for example a TRIAC connected to processor 312 via an optoisolator. Alternatively, or in combination, sensors 317, 318 and 319 may wirelessly communicate with processor 312 over wireless interface 315, e.g., via Bluetooth® or using any other wireless technology. In one or more embodiments, local sensors may be associated with a particular room by holding the sensors close to the power cord, which enables the sensors to register as devices associated with that particular power cord and hence be associated with the room number corresponding to the smart power cord. In one or more embodiments, feedback in the form of an LED or beep may indicate that a sensor is then associated with a particular smart cord for example.

Figure 4:
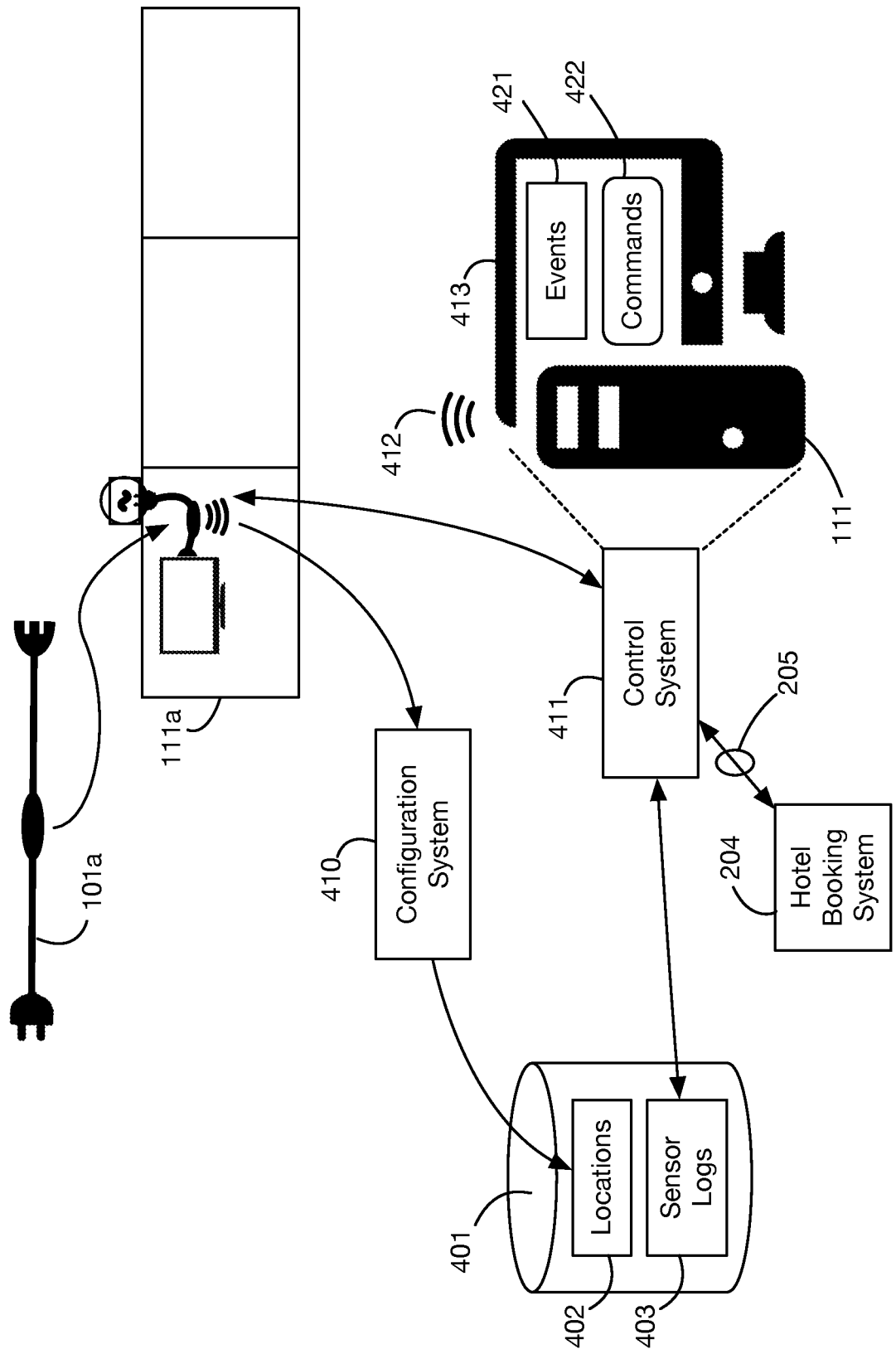
FIG. 4 shows an illustrative system architecture of a facility management system that uses smart power cords.

Smart power cords may be combined with other subsystems to form a facility management system. FIG. 4 shows an illustrative architecture of such a system. As described above with respect to FIG. 1, a smart power cord 101a may be installed a location 111a within a facility, such as a hotel room. During or after installation, a configuration system 410 may be used to generate data describing the smart power cord in a database 401. This database may include for example location data 402 that describes where each smart power cord is installed in the facility. Configuration may be performed manually or automatically, as described below. During operation, smart power cord 101a may transmit data to a control system 411 executing on one or more computers 111. The computer or computers 111 may have a network interface or interfaces 412 (wired or wireless) to communicate with the smart power cords. Control system 411 may update sensor log data 403 in database 401 based on the data received from the smart power cords. The control system 411 may also analyze and monitor the sensor log data 403, and may generate events 421 that are displayed on a display 413 showing a user interface. The control system 411 may also accept commands 422 and may transmit these commands to the smart power cords. In one or more embodiments, control system 411 may also have an interface 205 to a hotel booking system or other facility management system 204, and it may command the smart power cords based on data received from that system 204.

Figure 5:
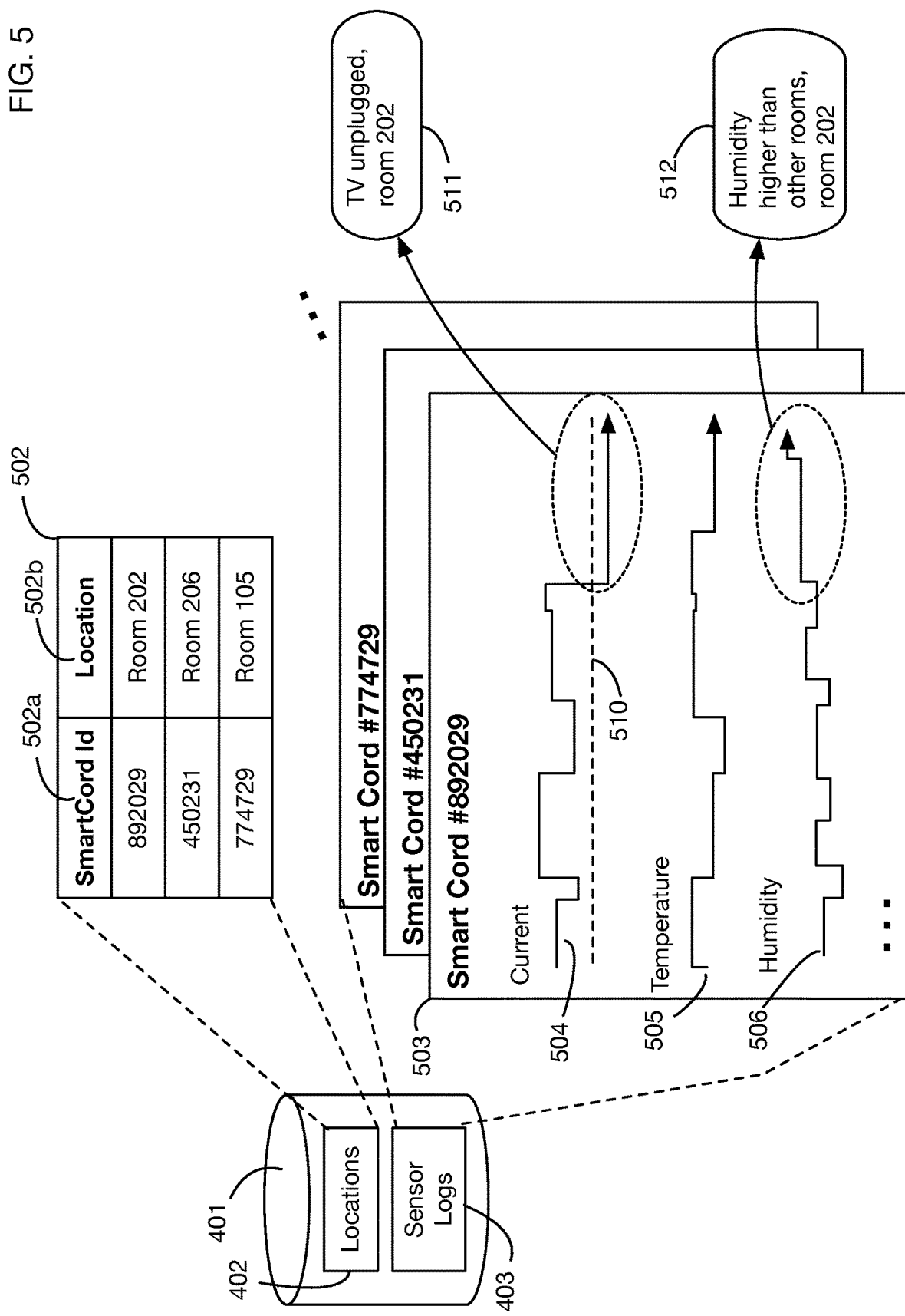
FIG. 5 shows illustrative events generated from analysis of sensor logs collected from smart power cords.

FIG. 5 shows in illustrative example of sensor log data and event generation. Location data 402 in database 401 contains location table 502 that associates each smart cord identifier 502a with a location 502b in which the smart power cord is installed. This location table may be generated by the configuration system when each smart power cord is installed or moved. Sensor log data 403 may contain for example a time series of sensor data for each of the three smart power cords identified in table 502. For example, data 503 for one of these smart power cords may have a time series 504 of current data, a time series 505 of temperature data, and a time series 506 of humidity data. The control system may monitor and process these time series to generate events that may be displayed to an operator. For example, when current 504 drops below a threshold value 510 (which may represent the standby current for a device that is plugged in but off), an event 511 may be generated that indicates that the device is unplugged. The event may include the location of the smart power cord, which is obtained from table 502. As another example, time series 506 of humidity data may be compared to similar data for other smart power cords, and flagged as an event 512 if it is excessive relative to the others. Higher humidity in one room may for example indicate an HVAC failure, an open window, or a water leak.

Figure 6:
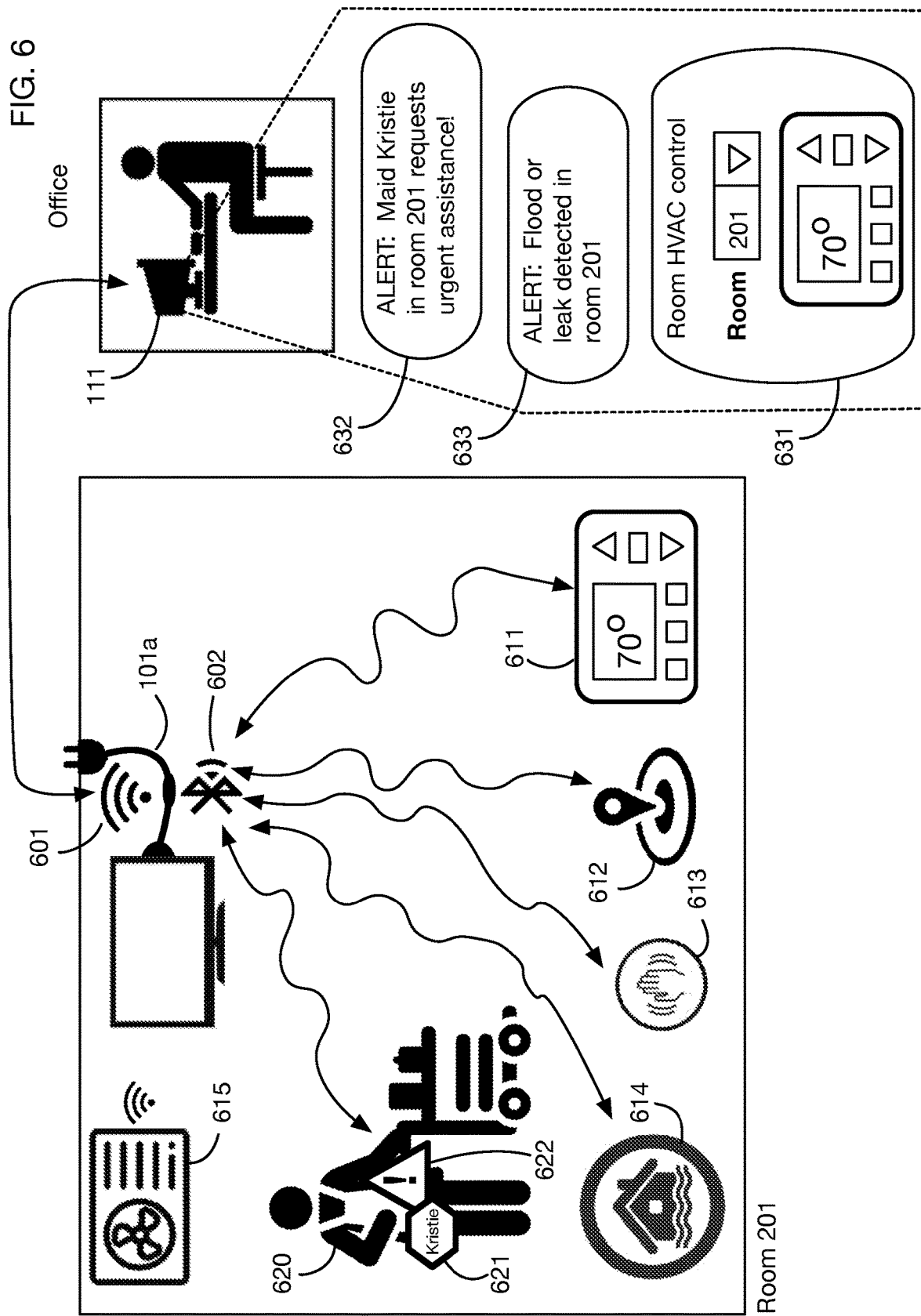
FIG. 6 shows an embodiment of a smart power cord that is a gateway to other devices in a room.

In one or more embodiments, smart power cords may also function as gateways for communication with other devices. This capability is illustrated in FIG. 6. In this embodiment smart power cord 101a has two wireless network interfaces—a Wi-Fi interface 601 and a Bluetooth interface 602. The Bluetooth interface 602 may be used to detect and connect to Bluetooth-enabled devices in the vicinity of the cord 101a, such as other devices in the room. Data from these devices may be transmitted to the smart power cord over the Bluetooth links, and forwarded to the facility control system 111 over the Wi-Fi interface 601. Device control commands may be sent from control system 111 to the smart power cord 101a over the Wi-Fi interface 601, and then forwarded over Bluetooth links to the local devices. Bluetooth links may include Bluetooth low energy links. The Wi-Fi and Bluetooth interfaces are illustrative; one or more embodiments may use any type or types of communications between smart power cords and devices. Illustrative devices that may link to the gateway functionality of smart power cord 101a may include a thermostat 611, a beacon 612, a motion sensor 613, and a water leak sensor 614. In one or more embodiments, thermostat 611 may also provide humidity sensor data, either in addition to or instead of a humidity sensor integrated into the smart power cord. An illustrative alert 633 may be generated if water leak sensor 614 detects water in the room; the sensor 614 may send this alert to the smart cord 101a, which forwards it to computer 111 in the facility office. Thermostat data from sensor 611 may be transmitted to smart cord 101a and then forwarded to computer 111 for display in control 631. HVAC control commands may be received in control 631 and then sent to smart cord 101a for forwarding to thermostat 611, or they may be transmitted directly to an HVAC unit 615 that is Wi-Fi enabled.

Smart cord 101a may also act as a gateway for devices carried by or attached to staff. For example, service staff 620 may optionally carry a beacon 621 and carry an alert button 622. Smart power cord 101a may receive beacon signals from beacon 621 and may forward this data to control system 111; this data allows the facility management system to determine the location of each staff member over time. If person 620 presses a control on an alert button 622, an alert signal may be transmitted to the smart power cord and forwarded to control system 111; this generates an emergency alert message 632 that indicates which staff member requests assistance and the current location of the staff member. In one or more embodiments, a double-tap on the alert button may be utilized to send an message 632 so that single taps do not send false alarms for example. One or more embodiments of the invention may require a manager to shut off the alarm so that a perpetrator cannot do so once message 632 has been sent. This enables maids that undergo sexual harassment or other emergencies to quickly receive help.

Figure 7B:
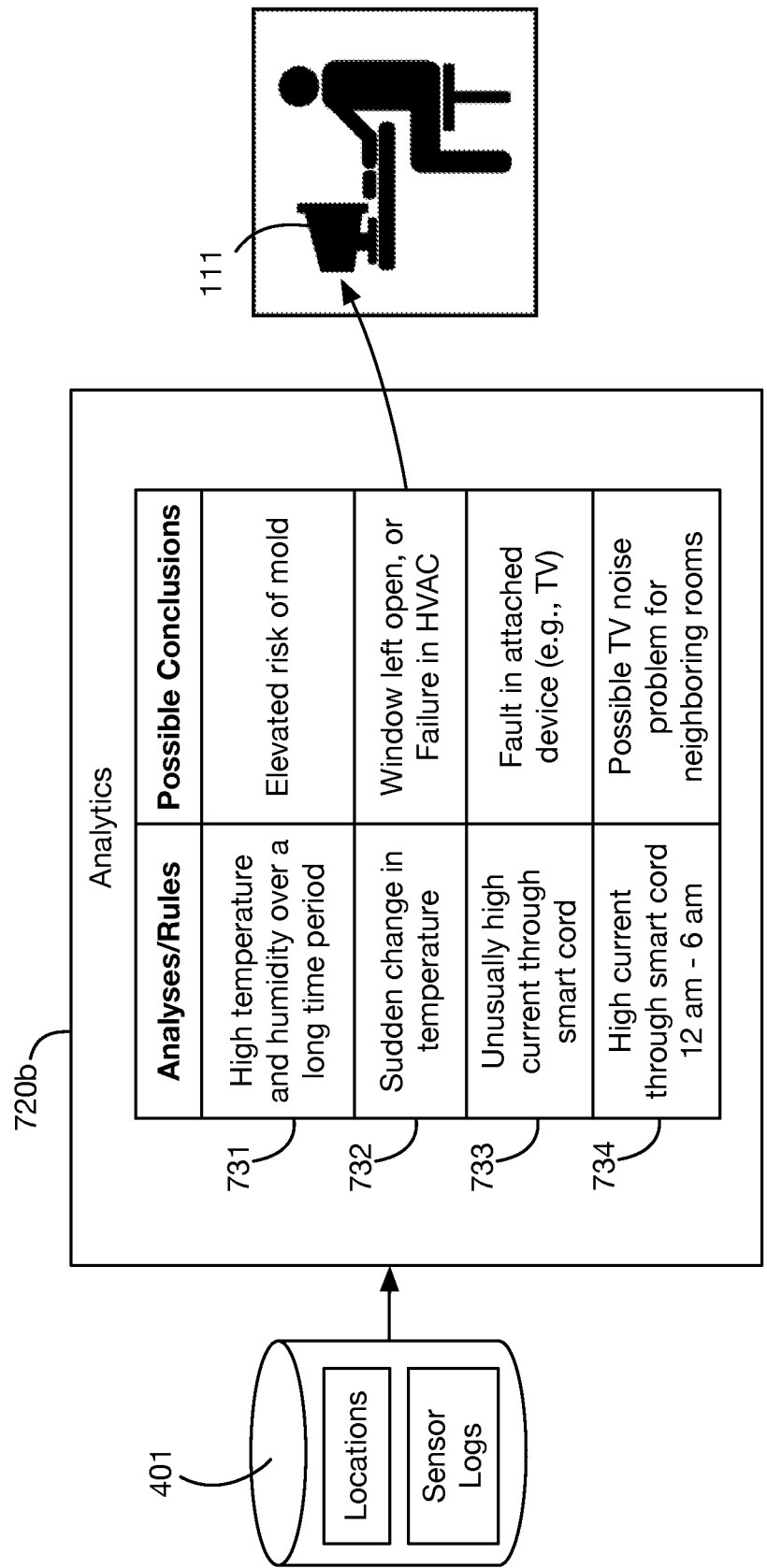

Data collected from sensors in the smart power cords, and from devices that forward data via the smart power cord gateways, may be analyzed continuously or periodically to generate various analytic reports that may be used to manage or optimize the facility. FIG. 7A through 7D show various illustrative examples of analytics based on this data. FIG. 7A illustrates analysis of staff movements through a facility. This data may be collected for example from beacons worn by or carried by staff, such as beacon 621 in FIG. 6. Data may be organized by staff member, date, time, and location. For example, data 701 may indicate that a staff member entered room 710 at time 711, and exited at time 712 on a certain date. Analytics 720*a* may be generated based on this aggregate staff location and movement data, to yield for example reports such as 721 that shows statistics for room cleaning times for individual staff members and on average. Similar analyses may be performed for example for maintenance staff, room service staff, or security staff.

FIG. 7B shows illustrative alerts that may be generated based on analyses 720*b* of trends and patterns in the data in database 401. Temperature and humidity data, collected for example from sensors embedded in the smart power cords, may be compared to rules 731 to determine whether one or more rooms are at elevated risk for mold. Mold growth typically requires elevated temperature and humidity over an extended period of time, combined with materials that favor growth. Temperature trends may be analyzed using a rule 732 that flags a sudden temperature change in a room, which may for example indicate an open window or a failure of an HVAC unit. Current passing through a smart power cord may be analyzed using rule 733 to detect a potential fault in an attached device, and rule 734 to detect a potential noise problem when a device is being used in the middle of the night. These rules and analyzes are illustrative; one or more embodiments may analyze any type of data in database 401 using any rules or processes to generate alerts, warnings, or reports.

Figure 7C:
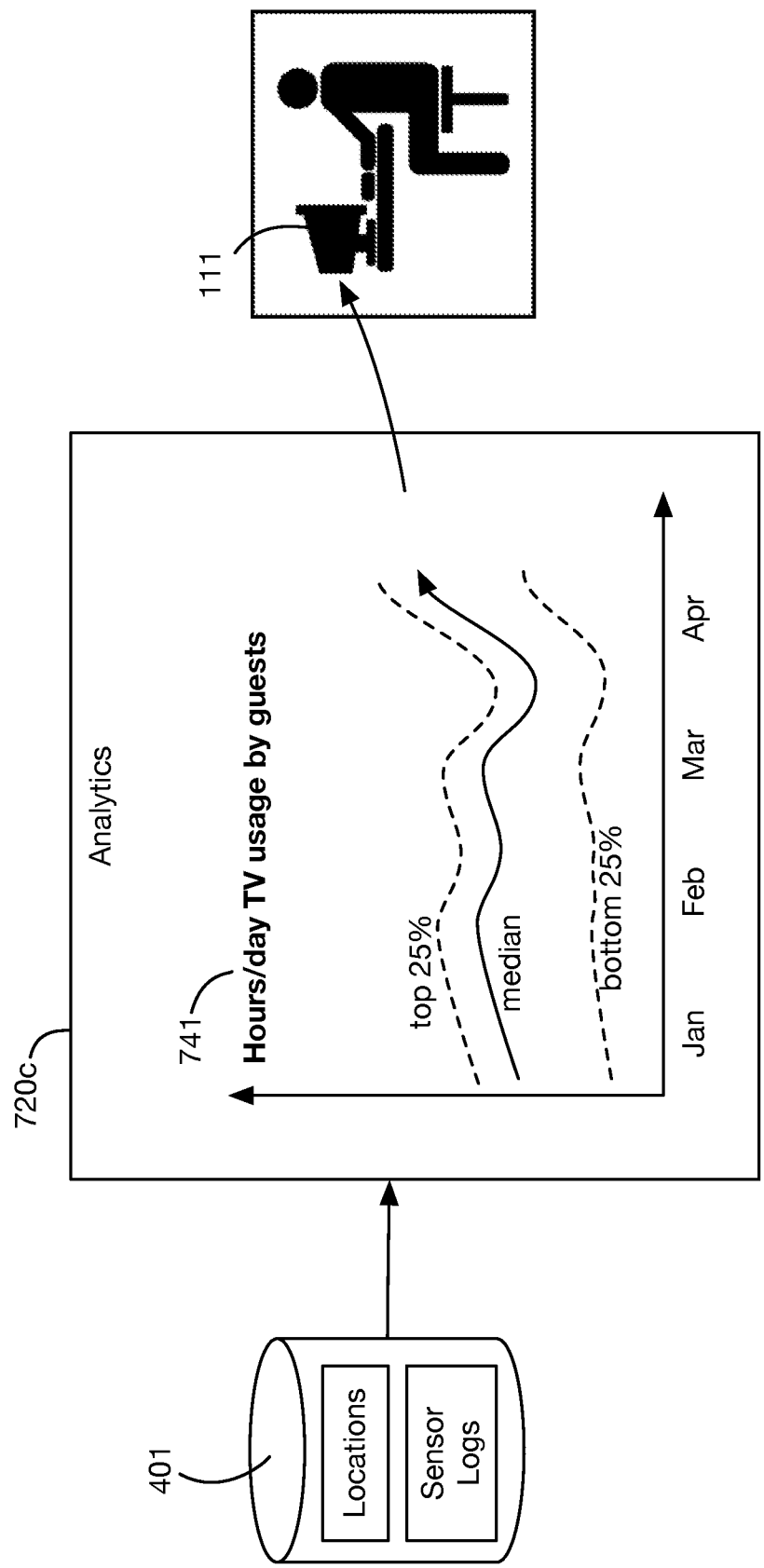

FIG. 7C shows an illustrative analysis 720*c* of the utilization of devices, in this case the utilization of televisions by hotel guests. This data may be calculated for example from the current sensor data collected from smart power cords. Statistics 741 on the trends and ranges in television usage may be generated and transmitted to an operator computer 111. This data may be useful for example for hotel management in determining how guests spend their time, and on how to allocate hotel resources accordingly. For example, hotels may utilize the analytics to provide events, for example wine tastings during peak electric rate hours to lower overall costs, by turning off televisions that are not in use. For hotels that do not have card holders that enable power on room entry, embodiments of the invention enable the equivalent power savings without the need or cost associated with adding a hotel electronic card power switch to each room.

Figure 7D:
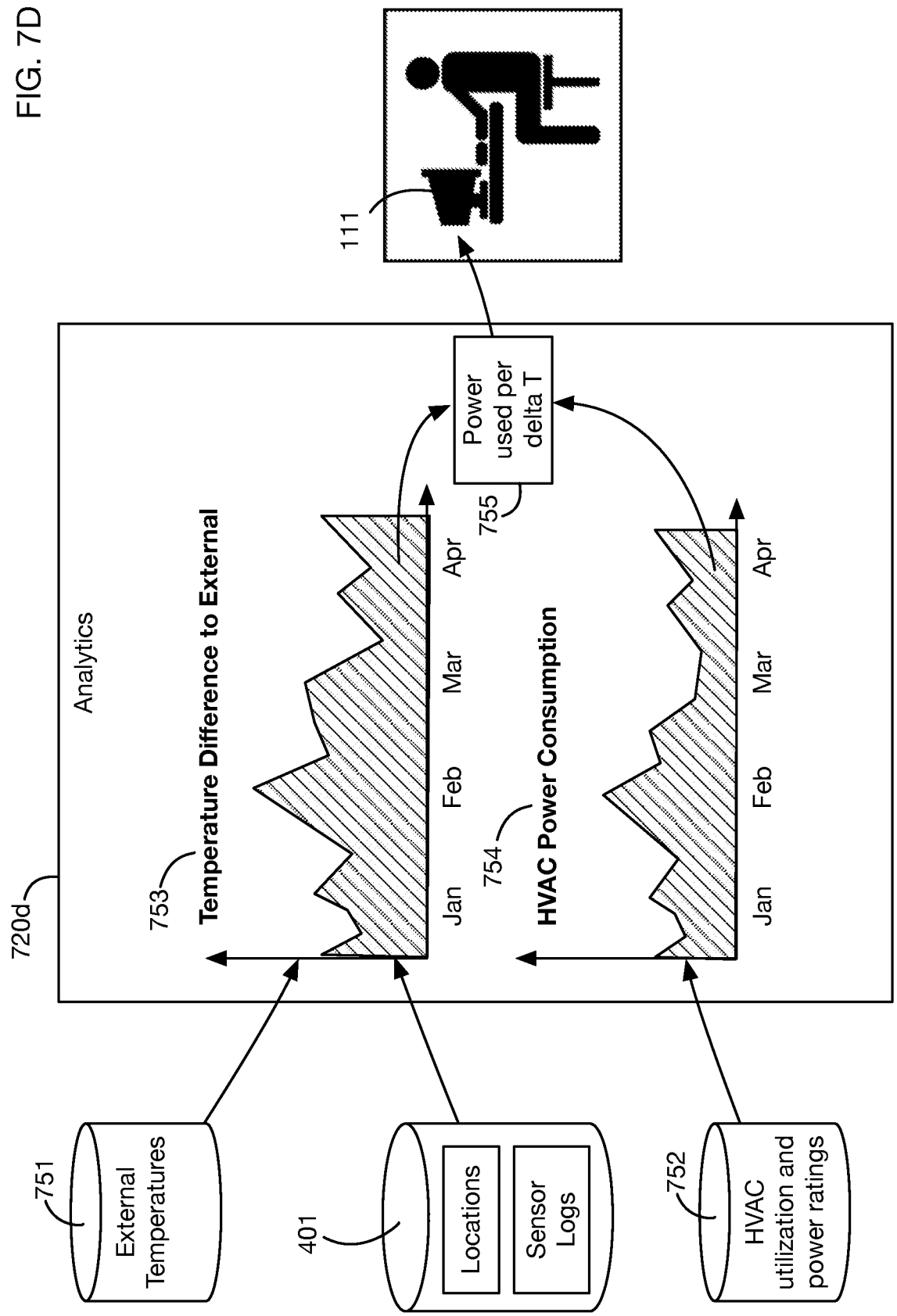

In one or more embodiments, sensor log data may be combined with other information to generate analytics for the facility. FIG. 7D shows an illustrative example of calculating the efficiency of the facility's HVAC system. This efficiency calculation 720*d* is based on the temperature difference 753 between the facility rooms and the external environment, and on the power consumption 754 of the HVAC system. The temperature difference 753 may be calculated from the temperature sensor data from the smart power cords combined with a data source 751 of external temperature data (such as a weather service). The HVAC power consumption may be obtained from HVAC units themselves (for example if they are network-enabled) or from other information such as HVAC usage and power ratings 752. In this example, aggregate power consumption 754 over a time period is compared to aggregate temperature differences 753 over this same time period to calculate an overall efficiency metric 755.

Figure 8:
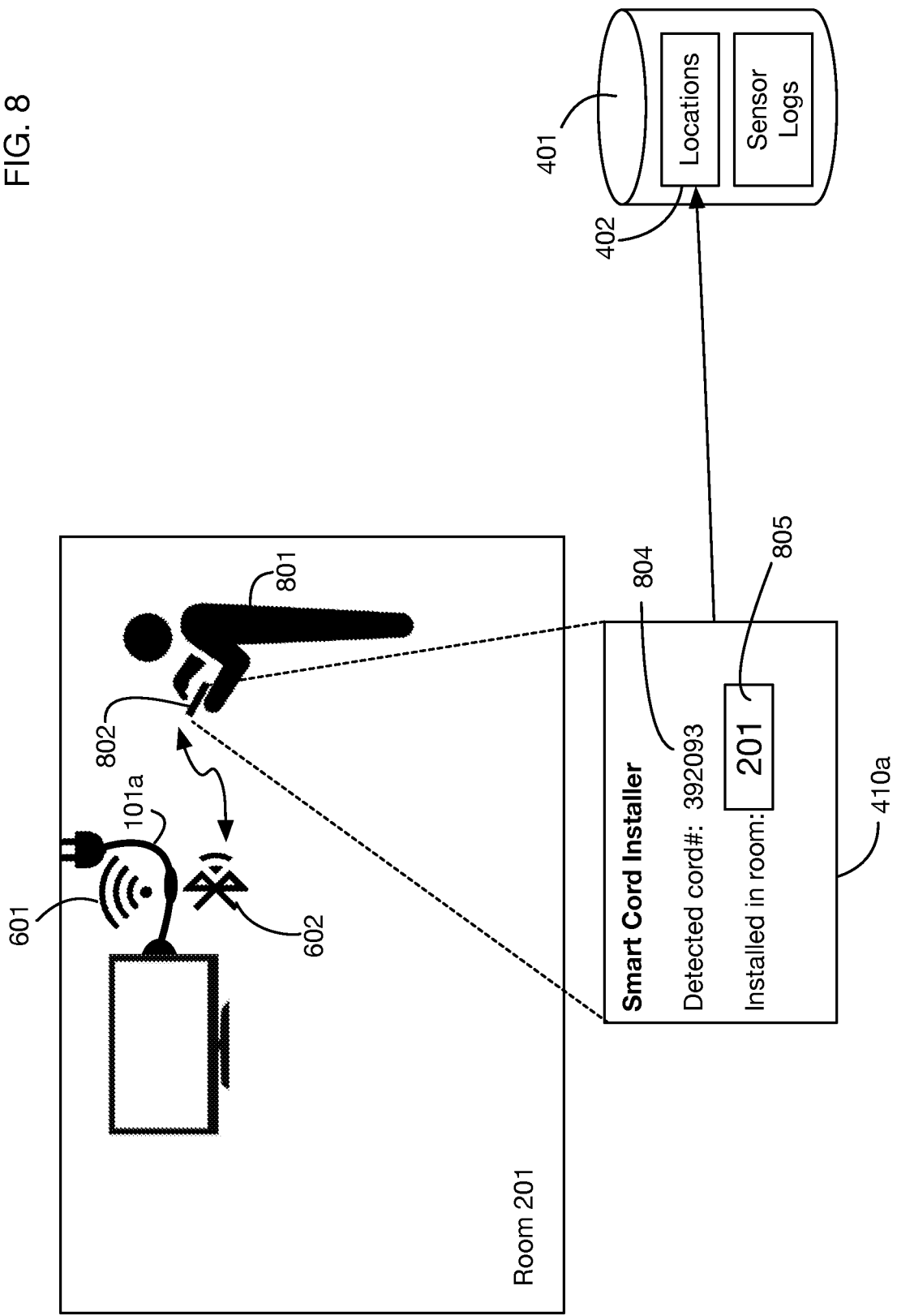
FIG. 8 shows an illustrative process for installing and manually configuring a smart power cord.

Turning now to the configuration system 410, FIG. 8 shows a manual smart power cord configuration process wherein a staff member 801, such as a maid, uses a mobile device 802 to manually configure the location of each installed smart power cord. This device 802 may for example make a Bluetooth link to the smart power cord interface 602, and forward data entered by the user 801 to the database 401. Device 802 may retrieve the smart power cord identifier 804 over this link, and the user may enter the location 805 into screen 410*a*. The association between the identifier 804 and the location 805 may then be added to location data 402 in database 401. Although this manual configuration mode requires user input, it is still significantly simpler than typical network installer scenarios. In one or more embodiments, running an app on device 802 that accepts a text based or audio-based input for the room number is one method that may be employed to associate a room number with the apparatus.

FIG. 9 shows an alternative configuration system that relies on beacons installed in each location. If each location has an existing beacon 612, then a smart power cord 101*a* may determine which location it is installed in by finding the nearest visible beacon. The smart power cord may then transmit this data 901 to the configuration system 410*b*, which updates the location data 402 accordingly. If multiple beacons are visible to a smart power cord, then it may use the estimated distance to each beacon to determine which beacon is closest, and use this beacon to determine the location in which the smart power cord is installed. Installing the smart power cord is performed by plugging the cord in; the cord then receives any beacon signals and optionally determines the highest power beacon signal to determine the room number that the apparatus is located in. The apparatus may also send out wireless signals to any routers within range to report identity and/or status as well as location. From this information, the system automatically integrates the apparatus unlike known devices that require technicians or installers to enter each room and interact with the device. Rather, embodiments of the invention enable a maid to simply replace a TV/heater/air conditioning cord with the apparatus that is then recognized by the system. In one or more embodiments, the device is merely plugged in and determines where it is based on the signal strengths of smart cords in other rooms. For example, installing a power cord in a particular room that has strong signals on either side of the room and the room identifiers of the other rooms are 202 and 204 that may have been set up manually, then embodiments of the system may receive the wireless signal from the smart cord apparatus, e.g., via a router in the hallway that communicates with the server in the system, wherein the server communicates with the smart cord to let it know that it is in room 203. Discovering the topology through use of maids that merely plug in the power cord is a great cost savings since the maids must go to the rooms to clean them up anyway and the time required to replace the old cord with a smart cord is seconds, versus many minutes with typical network installation methods that require trained technicians. The room number for example may be confirmed for example when maids or other personal traverse the hallways and determine the signal strength of the smart cords.

Instead of or in addition to using beacons to locate where each smart power cord is installed, one or more embodiments may use signal characteristics between smart power cords to automatically construct a map of where each smart power cord is located. This automated topology discovery configuration process is illustrated in FIG. 10. A facility map 1001 may be available that shows the relative location of each room. This map may be for example a 3D model or 2D model of the facility, an image of the facility, or a drawing of the facility. In some scenarios there may be one or more beacons 1005 and 1006 installed in known locations in the facility, although in other situations there may be no beacons at all. Smart power cords are then installed into rooms or other locations, and each smart power cord uses its wireless interface or interfaces to establish connections to neighboring smart power cords. One or more signal characteristics of these connections provide an indication of the relative distances between the different smart power cords. Characteristics that may be measured and used may include for example, without limitation, RSSI (received signal strength indicators), noise, signal quality, and time of flight delays. Signal characteristics may be reported from each smart power cord to the configuration system, which may then use this data to determine the location of each smart power cord. Either cooperative localization or non-cooperative localization techniques may be used to localize each smart power cord. In the embodiment shown in FIG. 10, the configuration system receives RSSI data from each smart power cord, and then generates a signal strength graph 1002, with nodes corresponding to smart power cord identifiers, and edges labeled with signal strengths (RSSIs) between nodes. For example, the signal between smart power cord 1021 and smart power cord 1022 has strength 1023. For embodiments with beacons, the beacons may also appear in the signal strength graph 1002. The facility map 1001 and the signal strength graph 1002 may then be input into configuration algorithm 410c that calculates the assignment of smart power cords to locations, and that updates the location data 402 accordingly. This algorithm 410c may for example search for an assignment of smart power cords to rooms so that the signal strength graph most closely matches the physical proximity of the rooms as described in the facility map. Beacons, if present, may provide constraints on selected assignments; for example, a smart power cord that is determined to be close to a beacon may be constrained to be only in rooms that are near the beacon.

While the invention herein disclosed has been described by means of specific embodiments and applications thereof, numerous modifications and variations could be made thereto by those skilled in the art without departing from the scope of the invention set forth in the claims.

What is claimed is:

1. A smart power cord, comprising:
    a power input connector configured to be detachably coupled to a power source;
    a power output connector configured to be detachably coupled to a device;
    a cable coupled to said power input connector and to said power output connector, comprising
        one or more conductors that transmit power from said power source to said device; and
        a jacket surrounding said one or more conductors;
    a monitoring and control element integrated into said cable, lying within said jacket, and comprising
        one or more sensors comprising
            a current sensor that measures a current flowing through said one or more conductors;
        a memory comprising an identifier;
        a switch coupled to one or more of said one or more conductors and configured to open or close;
        a first wireless transceiver configured to transmit and receive over a first wireless network;
        a second wireless transceiver configured to transmit and receive over a second wireless network different from said first wireless network;
        a processor coupled to said one or more sensors, to said memory, to said switch, to said first wireless transceiver, and to said second wireless transceiver, and configured to
            connect to a server over said first wireless network;
            receive sensor data from said one or more sensors, said sensor data comprising said current;
            tag said sensor data with said identifier;
            transmit said sensor data to said server over said first wireless network;
            receive a power command from said server over said first wireless network;
            open or close said switch based on said power command;
            connect to one or more local devices over said second wireless network;
            receive local device data from said one or more local devices over said second wireless network;
            forward said local device data to said server over said first wireless network;
            receive one or more local device commands from said server over said first wireless network; and,
            forward said one or more local device commands to said one or more local devices over said second wireless network.

2. The smart power cord of claim 1, wherein said device comprises a television.

3. The smart power cord of claim 1, wherein said server is configured to analyze said sensor data and said local device data to detect one or more events.

4. The smart power cord of claim 3, wherein
    said analyze said sensor data and said local device data comprises determine when said current falls below a threshold; and,
    said one or more events comprise an unplugged event when said current falls below said threshold.

5. The smart power cord of claim 1, wherein said one or more sensors further comprise one or more of
    a temperature sensor;
    a humidity sensor; and,
    a pressure sensor.

6. The smart power cord of claim 1, wherein
    said monitoring and control element further comprises a hard case lying within said jacket; and,
    said hard case surrounds
        said one or more sensors,
        said memory,
        said switch,
        said first wireless transceiver,
        said second wireless transceiver,
        and said processor.

7. The smart power cord of claim 6, wherein
    a length of said hard case along a longitudinal axis of said cable is 10 centimeters or less; and,
    a maximum diameter of a cross section of said hard case on a plane perpendicular to said longitudinal axis is 2 centimeters or less.

8. The smart power cord of claim 1, wherein
    said first wireless transceiver comprises a Wi-Fi transceiver; and, said second wireless transceiver comprises a Bluetooth transceiver.

9. The smart power cord of claim 1, wherein said one or more local devices comprise one or more of
   a thermostat;
   a leak detector;
   an HVAC unit;
   a beacon.

10. The smart power cord of claim 1, wherein said processor is further configured to
   determine signal strengths of connections between said processor and corresponding processors of one or more other smart power cords over said first wireless network and over said second wireless network;
   and transmit said signal strengths of connections to said server.

11. The smart power cord of claim 10, wherein said server is configured to
   calculate a position of said smart power cord and of said one or more other smart power cords based on said signal strengths of connections received from said smart power cord and from one or more other smart power cords.

12. The smart power cord of claim 1, further comprising a database, wherein said server is coupled with said database, and wherein said database comprises:
   location data comprising an association between the identifier of said smart power cord and a location of said smart power cord; and,
   a sensor data log associated with said smart power cord, said sensor data log comprising said sensor data.

13. The smart power cord of claim 12, wherein said server is coupled with
   a configuration system coupled to said database and configured to update said location data when said smart power cord is installed in said location.

14. The smart power cord of claim 13, wherein said configuration system comprises
   a portable device configured to
      accept said location from a user of said portable device;
      couple to said monitoring and control element of said smart power cord when said portable device is proximal to said smart power cord;
      obtain said identifier from said memory of said monitoring and control element; and,
      transmit said location data to said database.

15. The smart power cord of claim 1, wherein said server is coupled with
   a control system coupled to said database, comprising
      a control system network interface;
      a user interface; and
      a control system processor coupled to said control system network interface, and configured to
         receive said sensor data from said smart power cord via said control system network interface;
         update said sensor data log based on said sensor data;
         monitor said sensor data log associated with said smart power cord to detect events, wherein each event of said events comprises an associated smart power cord;
         display said each event in said user interface with the location associated with said associated smart power cord in said location data of said database;
         accept from said user interface said power command; and,
         transmit said power command to said smart power cord via said control system network interface.

16. The smart power cord of claim 15, wherein
   said monitoring and control element further comprises
      a wireless interface coupled to said processor;
   said processor is further configured to
      detect one or more local devices proximal to said location of said smart power cord;
      receive local device data from said one or more local devices via said wireless interface; and,
      forward said local device data to said control system via said wireless interface.

17. The smart power cord of claim 16, wherein
   said one or more local devices comprise a beacon configured to be coupled to a person.

18. The smart power cord of claim 17, wherein
   said beacon is configured to accept an assistance request from said person;
   said events comprise an assistance request event when said beacon reports said assistance request; and,
   said assistance request event comprises
      an identity of said person; and
      a location of said person.

19. The smart power cord of claim 16, further comprising a database,
   wherein said server is coupled with said database;
   wherein said database comprises
      location data comprising an association between the identifier of said smart power cord and a location of said smart power cord, and,
      a sensor data log associated with said smart power cord, said sensor data log comprising said sensor data;
   wherein said server is coupled with
      a configuration system coupled to said database and configured to update said location data when said smart power cord is installed in said location; and,
   wherein
      said one or more local devices comprise one or more beacons;
      said configuration system comprises an application configured to execute on one or more of said processor and said control system processor, wherein said application is configured to estimate said location of said smart power cord based on
         beacon locations of said one or more beacons detected by said processor; and,
         one or both of
            visibility of said one or more beacons, and
            estimated distance to said one or more beacons.

20. The smart power cord of claim 15, further comprising a database,
   wherein said server is coupled with said database;
   wherein said database comprises
      location data comprising an association between the identifier of said smart power cord and a location of said smart power cord, and,
      a sensor data log associated with said smart power cord, said sensor data log comprising said sensor data; and,
   wherein said control system processor is further configured to
      analyze said sensor data log to generate analytics; and,
      display said analytics in said user interface.

* * * * *